(12) United States Patent  
Nakahara

(10) Patent No.: US 9,029,072 B2
(45) Date of Patent: May 12, 2015

(54) LIQUID CRYSTAL DISPLAY MANUFACTURING METHOD

(71) Applicant: Sharp Kabushiki Kaisha, Osaka (JP)

(72) Inventor: Hijiri Nakahara, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/378,079

(22) PCT Filed: Feb. 15, 2013

(86) PCT No.: PCT/JP2013/053650
§ 371 (c)(1),
(2) Date: Aug. 11, 2014

(87) PCT Pub. No.: WO2013/122184
PCT Pub. Date: Aug. 22, 2013

(65) Prior Publication Data
US 2015/0031154 A1 Jan. 29, 2015

(30) Foreign Application Priority Data
Feb. 17, 2012 (JP) ................................. 2012-033296

(51) Int. Cl.
*G02F 1/1343* (2006.01)
*H01L 27/12* (2006.01)
*G02F 1/1362* (2006.01)

(52) U.S. Cl.
CPC .......... *H01L 27/1288* (2013.01); *G02F 1/1362* (2013.01); *G02F 2001/134372* (2013.01);
(Continued)

(58) Field of Classification Search
CPC .................. G02F 1/1362; G02F 2001/134372; G02F 2201/40; G02F 2001/13629; G02F 2001/13625; H01L 27/1288; H01L 27/1296

USPC ................... 430/316, 318, 319, 321; 438/30
See application file for complete search history.

(56) References Cited

U.S. PATENT DOCUMENTS

| 6,259,500 B1 * | 7/2001 | Kijima et al. .................. 349/113 |
| 2008/0303024 A1 * | 12/2008 | Song et al. ...................... 257/59 |
| 2011/0216278 A1 | 9/2011 | Nagano et al. |

FOREIGN PATENT DOCUMENTS

| JP | 4-84125 A | 3/1992 |
| JP | 2011-186138 A | 9/2011 |

OTHER PUBLICATIONS

Translation of JP 4-084125 A (Mar. 1992).*

*Primary Examiner* — John A McPherson
(74) *Attorney, Agent, or Firm* — Chen Yoshimura LLP

(57) ABSTRACT

Provided is a liquid crystal display manufacturing method that is capable of improving the aperture ratio while suppressing unevenness in the display. The present invention is a method of manufacturing a liquid crystal display provided with an array substrate including an insulating layer, a source bus line and a pixel electrode, in which the source bus line and pixel electrode are provided on the insulating layer, and the source bus line includes a lower layer and an upper layer layered onto the lower layer. This manufacturing method includes a first photolithography step for using a first photomask to pattern the first conductive film, and, after the first photolithography step, a second photolithography step for using a second photomask to pattern at least a second conductive film and forming the source bus line and the pixel electrode. In the first photolithography step, the first conductive film is removed in at least an opening region without being removed at least in the region where the lower layer is formed, and the lower layer and upper layer are formed of the first conductive film and a second conductive film, respectively.

2 Claims, 17 Drawing Sheets

(52) U.S. Cl.
CPC ................ *G02F2001/13625* (2013.01); *G02F 2001/13629* (2013.01); *G02F 2201/40* (2013.01); H01L 27/1296 (2013.01)

45
13

51

LIQUID CRYSTAL DISPLAY MANUFACTURING METHOD

TECHNICAL FIELD

The present invention relates to a method of manufacturing a liquid crystal display. More specifically, the present invention relates to a method of manufacturing a liquid crystal display that is suitably manufactured by a method of manufacturing a fringe field switching (FFS) liquid crystal display.

BACKGROUND ART

The liquid crystal display includes a display portion in which a plurality of pixels are arranged, is a display device that displays characters and images, and is widely used in devices such as mobile phones, laptop computers, and liquid crystal televisions. As such a liquid crystal display, the active matrix-driven liquid crystal display is widely known. This type of liquid crystal display includes an active matrix substrate (also referred to as an array substrate below), and the array substrate generally has wiring lines such as data bus lines and gate bus lines, pixel electrodes, and switching elements such as thin film transistors (TFT) in a region corresponding to the display portion (also referred to as a display region below).

In-plane switching (IPS) type liquid crystal displays include an array substrate in which a plurality of pixel electrodes and a plurality of common electrodes (opposite electrodes) are arranged at a gap from each other, and perform display by applying an electric field (horizontal electric field) to the liquid crystal layer, the electric field being substantially parallel to the surface of the substrate. The IPS method has an excellent viewing angle compared to general TN (twisted nematic) type devices. However, conventional IPS devices had a smaller light transmittance compared to general TN devices. This is because in conventional IPS devices, the pixel electrodes and the common electrodes mostly do not contribute to display.

As a method to mitigate this problem, the FFS method is proposed. FFS type liquid crystal displays perform display by applying a fringe field to a liquid crystal layer (an electric field including both horizontal and vertical electric field components). In FFS type liquid crystal displays, like in IPS devices, the pixel electrodes and the common electrodes are both formed on the array substrate, but the pixel electrodes and the common electrodes are disposed across an insulating layer from each other in the up-and-down direction. Normally, the electrodes disposed below (also referred to as lower electrodes below) are plate-shaped, and the electrodes disposed above (also referred to as upper electrodes below) have a plurality of slits formed therein to form an interdigital shape.

In the FFS method, the pixel electrodes may be either the lower electrodes or the upper electrodes. In the FFS method, the liquid crystal layer is driven by a fringe field generated between the upper electrodes and the lower electrodes. Thus, it is possible to drive the liquid crystal layer above the upper electrodes, and thus these portions can contribute to display. Thus, the light transmittance can be made greater than in conventional IPS devices.

As an FFS-type liquid crystal display, a liquid crystal display device that includes scan wiring lines, signal wiring lines, lower electrodes connected to the drain electrodes of the TFTs, and upper electrodes disposed above the lower electrodes across a protective film; second contact holes are formed in the protective film on a conductive pattern at the same potential as the lower electrodes in regions where the upper electrode is not formed and where light does not pass through, and a protective film is removed (see Patent Document 1, for example).

RELATED ART DOCUMENT

Patent Document

Patent Document 1: Japanese Patent Application Laid-Open Publication No. 2011-186138

SUMMARY OF THE INVENTION

Problems to be Solved by the Invention

However, with the FFS method, if the pixel electrode and the source bus line are on the same insulating layer, the liquid crystal capacitance is very susceptible to being affected by the capacitance formed between the pixel electrode and the source bus line (also referred to as Csd capacitance below). Therefore, if the Csd capacitance differs depending on the location in the display region, the difference in Csd capacitance is a direct cause of display unevenness. Therefore, there is a need to increase the distance between the pixel electrodes and the source bus lines, which causes a decrease in aperture ratio, which was a point for improvement.

With reference to FIGS. 30 to 40, a liquid crystal display of Comparison Example 1 will be used to describe causes for Csd capacitance differences.

As shown in FIGS. 30 and 31, an array substrate 1010 included in the liquid crystal display of Comparison Example 1 has: an insulating substrate 1011; gate bus lines 1013 on the insulating substrate 1011; an insulating layer 1016 that covers the gate bus lines 1013; source bus lines 1012, a semiconductor layer 1021, source electrodes 1023, drain electrodes 1024, and pixel electrodes 1014 disposed on the insulating layer 1016; a passivation layer 1017 that covers these, and a common electrode 1015 on the passivation layer 1017. The semiconductor layer 1021, the source electrode 1023, the drain electrode 1024, a gate electrode 1022, which is a portion of the gate bus line 1013, and the insulating layer 1016 function as a TFT 1020. The common electrode 1015 has slits 1015S that are parallel to each other formed therein. An image signal is applied from the source bus line 1012 to the pixel electrode 1014 through the TFT 1020. A prescribed voltage common to all pixels is applied to the common electrode 1015.

The array substrate 1010 is manufactured as described below.

As shown in FIG. 32, a gate bus line 1013, an insulating layer 1016, and a semiconductor layer 1021 are formed in this order on the insulating substrate 1011. Next, a conductive film 1041 is formed.

Next, as shown in FIG. 33, after forming a resist film 1042 on the conductive film 1041, the resist film 1042 is exposed through a photomask 1043. As shown in FIG. 34, the exposure device may be a lens-scanning type exposing device (stepper) that includes a plurality of lenses 71, adjacent lenses 71 overlapping in part, and in such a case, portions of the resist film 1042 (also referred to as seam portions below) are exposed in portions where the lenses 71 overlap. In a lens-scanning type exposing device, the amount of exposure is adjusted by the respective lenses 71 having a trapezoidal shape in a cross-sectional view such that exposure amount does not differ between regions exposed through the overlap of the lenses 71 and regions exposed through portions where adjacent lenses 71 do not overlap. However, in reality, small differences in exposure occur between the seam portions of the resist film 1042 and other portions of the resist film 1042 (portions exposed through where the adjacent lenses 71 do not overlap), and such differences are greater the more detailed the pattern is. The width of the seam portion is approximately equal to the width of a few dozen pixels, which is perceivable as display unevenness.

Next, as shown in FIG. 35, the exposed resist film 1042 is etched (developed), thus forming the resist pattern 1044. At this time, the resist pattern 1044 is formed so as to set the width of the source bus line 1012. Thus, due to the alignment of the photomask 1043, the resist pattern 1044 is not formed where expected, which results in the source bus line 1012 being formed away from where it is designed to be formed. Also, when using a lens-scanning type exposure device, differences in exposure between the seam portions and other portions result in differences in line width of the resist pattern 1044, and the width of the source bus lines 1012 is varied among the corresponding regions.

As shown in FIG. 36, the resist pattern 1044 is used as a mask and a portion of the conductive film 1041 is etched away, thus forming the source bus line 1012, the source electrode 1023, and the drain electrode 1024. At this time, the conductive film 1041 is etched so as to set the width of the source bus line 1012, and thus, the width of the source bus line 1012 differs from what was originally designed.

Next, as shown in FIG. 37, a transparent conductive film 1051 is formed.

Next, as shown in FIG. 38, after the resist film 1052 is formed on the transparent conductive film 1051, a resist film 1052 is exposed through a photomask 1053. At this time, the exposure device may be the lens-scanning type exposure device (stepper) shown in FIG. 34, and in such a case, portions of the resist film 1052 (seams) are exposed through portions where the lenses 71 overlap. Also, small differences in amount of exposure occur between the seams of the resist film 1052 and other portions of the resist film 1052, and thus, the more detailed the pattern is, the greater the difference is.

Next, as shown in FIG. 39, the exposed resist film 1052 is etched (developed), thus forming the resist pattern 1054. At this time, the resist pattern 1054 is formed to set the width of the pixel electrode 1014. Thus, due to the alignment of the photomask 1053, the resist pattern 1054 is not formed where expected, which results in the pixel electrode 1014 being formed away from where it is designed to be formed. The size of positional deviation of the pixel electrodes 1014 differs from the size of positional deviation of the above-mentioned source bus lines 1012. Thus, the relative positions of the source bus lines 1012 with respect to the pixel electrodes 1014 largely deviate from what was designed. Also, when using a lens-scanning type exposure device, differences in exposure between the seam portions and other portions result in differences in width of the resist pattern 1054, and the width of the pixel electrodes 1014 is varied among the corresponding regions. The amount of change in width of the pixel electrodes 1014 differs from the amount of change in width of the source bus line 1012 resulting from the above-mentioned lens-scanning type exposure device. Thus, the width of the source bus line 1012 relative to the width of the pixel electrode 1014 varies greatly depending on the position.

As shown in FIG. 40, the resist pattern 1054 is used as a mask, and a portion of the transparent conductive film 1051 is etched away, thus forming the pixel electrode 1014. At this time, the transparent conductive film 1051 is etched so as to set the width of the pixel electrode 1014. Thus, the width of the pixel electrode 1014 differs from what was designed. The difference in width of the pixel electrode 1014 from what was designed greatly differs from the difference in width of the source bus line 1012 from what was designed due to the above-mentioned etching. Thus, the width of the source bus line 1012 relative to the width of the pixel electrode 1014 deviates greatly from what was designed.

As described above, the mask for forming the source bus lines and the mask for forming the pixel electrodes are different, which results in the following deviations:

deviation in positional relation between the source bus line and the pixel electrode; and positional deviation in gaps between the source bus line and the pixel electrode.

These positional deviations result in differences in Csd capacitance.

The present invention takes into account the situation above, and an object thereof is to provide a method of manufacturing a liquid crystal display by which it is possible to improve aperture ratio while mitigating the occurrence of display unevenness.

Means for Solving the Problems

The inventor of the present invention has considered various methods of manufacturing a liquid crystal display by which it is possible to mitigate uneven display while improving the aperture ratio, and has focused on the photolithography steps in the process of manufacturing an array substrate. The inventor of the present invention has found that by (1) using a multilayer structure including a lower layer and an upper layer as the structure for the source bus line, (2) not removing the first conductive film in at least regions where the lower layer is formed and removing the first conductive film in at least an opening region during a first photolithography step of patterning the first conductive film using a first photomask, and (3) forming the source bus line and the pixel electrode in the second photolithography step of patterning at least a second conductive film using a second photomask, (I) there is no need to set the width of the source bus line in the first photolithography step, (II) it is possible to mitigate deviating positional relations between the source bus line and the pixel electrode because the source bus line and the pixel electrode can be formed simultaneously using the same second photomask in the second photolithography step, and (III) deviation in the gap between the source bus line and the pixel electrode can be mitigated because it is possible to set the width of the source bus line and the pixel electrode in the same second photolithography step. As a result, the inventor of the present invention has found that it is possible to mitigate variations in Csd capacitance, and it is possible to mitigate the occurrence of uneven display even if the gap between the source bus line and the pixel electrode is small, and has been able to solve the above-mentioned problem and arrive at the present invention.

That is, one aspect of the present invention is a method of manufacturing a liquid crystal display (also referred to as a first manufacturing method of the present invention below), the liquid crystal display including an active matrix substrate, the active matrix substrate including an insulating layer, and a source bus line and a pixel electrode, both of which are provided on the insulating layer, the source bus line including a lower layer and an upper layer layered on the lower layer, the method including: forming a first conductive film on the insulating layer on the active matrix substrate; a first photolithography step of patterning the first conductive film using a first photomask, the patterned first conductive film including at least a portion to become the lower layer of the source bus line and being absent in at least a region where the pixel electrode is to be formed; forming a second conductive film over the patterned first conductive film and on a portion of the insulating layer where the first conductive film is absent; and a second photolithography step of patterning at least the second conductive film using a second photomask to form the upper layer of the source bus line and the pixel electrode both made of the second conductive layer, thereby forming the source bus line.

As long as these steps are included as necessary steps, there is no special limitation on other steps in the first manufacturing method of the present invention.

Another aspect of the present invention is a method of manufacturing a liquid crystal display is a method of manufacturing a liquid crystal display (also referred to as a second manufacturing method of the present invention below), the liquid crystal display including an active matrix substrate, the active matrix substrate including an insulating layer, and a source bus line and a pixel electrode, both of which are provided on the insulating layer, the source bus line including a lower layer and an upper layer layered on the lower layer, the method including: forming a first conductive film on the insulating layer on the active matrix substrate; a first photolithography step of patterning the first conductive film using a first photomask, the patterned first conductive film including at least a portion to become the lower layer of the source bus line and being absent in at least a region where the pixel electrode is to be formed; forming a second conductive film over the patterned first conductive film and on a portion of the insulating layer where the first conductive film is absent; and a second photolithography step of patterning at least the second conductive film using a second photomask to form the upper layer of the source bus line and the pixel electrode both made of the second conductive layer, thereby forming the source bus line having the first conductive film as the lower layer and the second conductive film as the upper layer.

As long as these steps are included as necessary steps, there is no special limitation on other steps in the second manufacturing method of the present invention.

In the first and second manufacturing methods of the present invention, the opening region is a portion where light is transmitted or reflected, and signifies a region in the liquid crystal display that contributes to display.

In the first and second manufacturing methods of the present invention, the upper layer is generally formed in the second photolithography step. On the other hand, in the first and second manufacturing methods of the present invention, there is no special limitation on the step in which the lower layer is formed, but either the first or second photolithography step is suitable.

Other preferred embodiments of the first and second manufacturing methods of the present invention will be described below in detail.

It is preferable that the second conductive film be transparent. As a result, it is possible to mitigate the occurrence of display unevenness, and to manufacture a transmissive liquid crystal display having a high aperture ratio. Here, transparent does not necessarily mean that all light is allowed to pass through, that is, that the light transmittance is 100%; the transmittance simply needs to be at or above a certain level. Specifically, in the embodiments, it is preferable that the light transmittance of the second conductive film be 84% to 98% and even more preferable that the light transmittance thereof be 88% to 92%. If the transmittance exceeds 98%, the second conductive film becomes thin (at or below approximately 20 nm, for example), which can result in display anomalies resulting from an increase in contact resistance. If the transmittance is less than 84%, then there is a possibility that the second conductive film takes on a yellowish tone, which can cause the entire liquid crystal panel to have a yellowish tone.

In the first photolithography step, the first conductive film may be patterned to form a conductive pattern larger than the lower layer of the source bus line, and in the second photolithography step, the conductive pattern of the first conductive film and the second conductive film may be patterned to form the lower layer and the upper layer, respectively of the source bus line.

In the first photolithography step, the first conductive film may be patterned to form the lower layer of the source bus line, and in the second photolithography step, only the second conductive film may be patterned to form the upper layer of the source bus line.

Effects of the Invention

According to the present invention, it is possible to attain a method of manufacturing a liquid crystal display by which it is possible to improve the aperture ratio while mitigating uneven display.

DETAILED DESCRIPTION OF EMBODIMENTS

Embodiments are shown below and the present invention is described in further detail with reference to the drawings, but the present invention is not limited to these embodiments.

Embodiment 1

Figure 1:
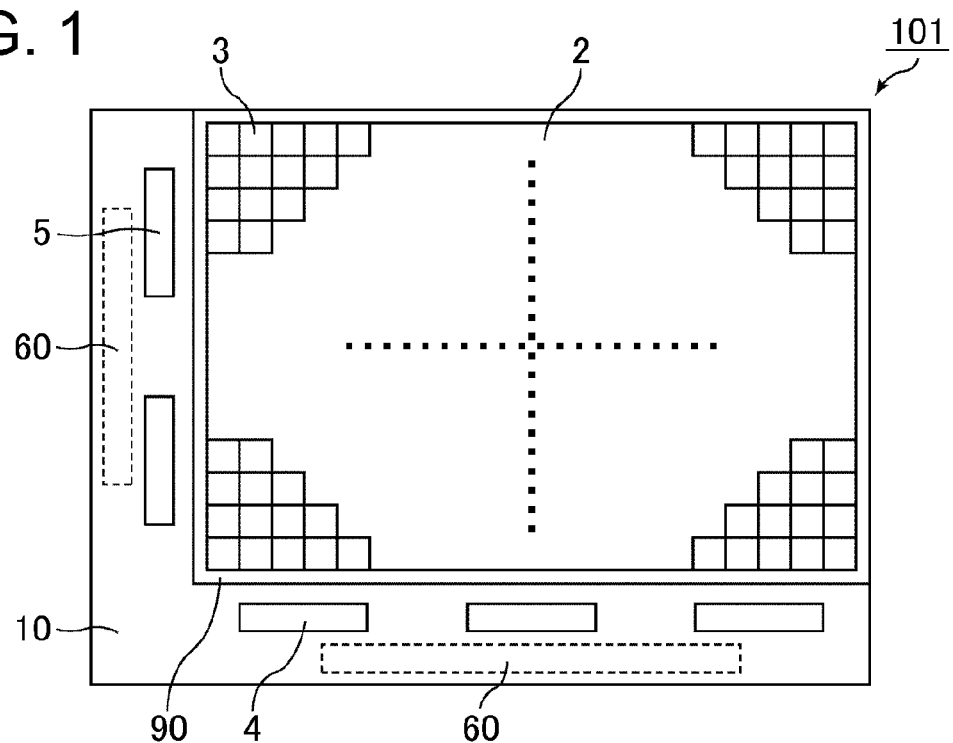
FIG. 1 is a schematic plan view of a liquid crystal panel included in a liquid crystal display of Embodiment 1.

A liquid crystal display of Embodiment 1 is an active matrix-driven transmissive liquid crystal display, and as shown in FIG. 1, includes a liquid crystal panel 101, a backlight (not shown) disposed to the rear of the liquid crystal panel 101, a control unit (not shown) that drives and controls the liquid crystal panel 101 and the backlight unit, and a flexible substrate (not shown) that connects the liquid crystal panel 101 to the control unit.

The liquid crystal display of the present embodiment includes a display portion 2 that displays images, and in the display portion 2, a plurality of pixels 3 are arranged in a matrix. The pixels 3 include sub-pixels of a plurality of colors (the three colors of red, green, and blue, for example). However, the liquid crystal display of the present embodiment may be a monochromatic liquid crystal display, and in such a case, the pixels 3 need not be divided into a plurality of sub-pixels.

The liquid crystal panel 101 has an active matrix substrate 10 (array substrate), an opposite substrate 90 that faces the array substrate 10 and on which members such as color filters, a black matrix, and the like are provided, a liquid crystal layer (not shown) provided between the substrates 10 and 90, a horizontal alignment film (not shown) provided on a surface of the array substrate 10 facing the liquid crystal layer, a horizontal alignment film (not shown) provided on a surface of the opposite substrate 90 facing the liquid crystal layer, and a source driver 4 and a gate driver 5 respectively mounted on the array substrate 10. The array substrate 10 is provided towards the rear of the liquid crystal display, and the opposite substrate 90 is provided towards the viewer side. On the surfaces of the substrates 10 and 90 opposite to the liquid crystal layer, polarizing plates (not shown) are bonded. These polarizing plate are generally disposed in a crossed Nicols state. The source drivers 4 and the gate drivers 5 are mounted by the COG (chip on glass) technique in a region of the array substrate 10 not facing the opposite substrate 90, or in other words, a portion of the array substrate 10 protruding from the opposite substrate 90 (also referred to as the frame region below).

The array substrate 10 includes a terminal region 60 where the terminals thereof are located, and has a plurality of terminals (not shown) formed in the terminal region 60. The respective terminals are connected to terminals formed on the flexible substrate. Also, the array substrate 10 has many wiring lines such as lead-out wiring lines and input wiring lines in the frame region, but these are omitted from the drawing in order to simplify the depiction. The lead-out wiring lines are wiring lines that extend from the region corresponding to the display portion 2, or in other words, from the display region to the output portion of the source driver 4 or the gate driver 5, and the respective input wiring lines are wiring lines that connect the input portion of the source driver 4 or the gate driver 5 to the terminals in the terminal region 60.

The plan view structure of the region corresponding to a sub-pixel of the array substrate 10 (also referred to as the sub-pixel area below) will be described with reference to FIG. 2.

Figure 2:
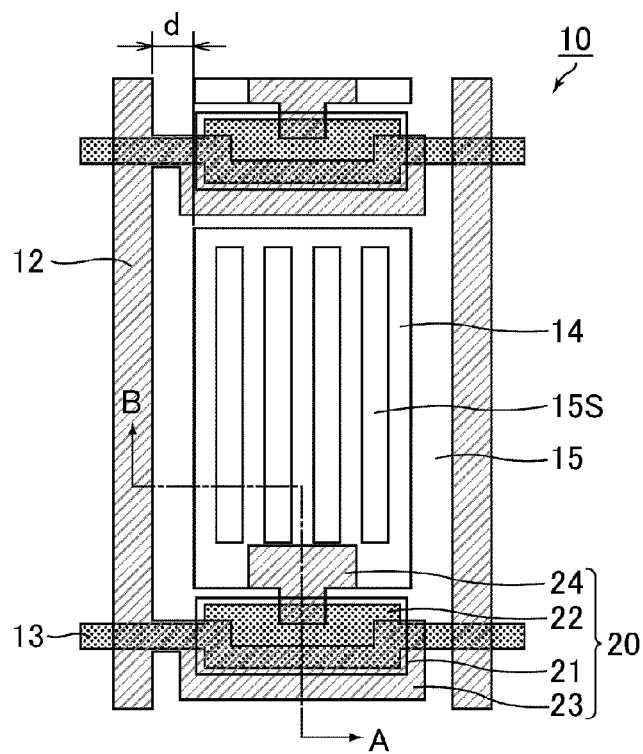
FIG. 2 is a schematic plan view that shows a sub-pixel area of an array substrate included in the liquid crystal display of Embodiment 1.

As shown in FIG. 2, the array substrate 10 has source bus lines 12 that are parallel to each other, gate bus lines 13 that intersect with the source bus lines 12, a TFT 20 connected to a source bus line 12, a pixel electrode 14 connected to the TFT 20, and a common electrode 15 (opposite electrode). The respective pixel electrodes 14 have a plate shape, and are provided in the area delineated by the source bus lines 12 and the gate bus lines 13. The TFT 20 is provided in each sub-pixel area. The common electrode 15 is provided so as to cover all sub-pixel areas, or in other words, the display region, but in each sub-pixel area, slits 15S that are parallel to each other are formed, and thus, the common electrode 15 has line portions that are parallel to each other.

The liquid crystal molecules in the liquid crystal layer (generally nematic liquid crystal) are oriented in a direction at a prescribed angle to the slits 15S and parallel to the surface of the substrates 10 and 90 when voltage is not being applied.

The TFT 20 functions as a switching element and includes a semiconductor layer 21, a gate electrode 22, a source electrode 23, and a drain electrode 24. A portion of the gate bus line 13 functions as the gate electrode 22. The source electrode 23 is connected to the source bus line 12, and the drain electrode 24 is connected to the pixel electrode 14. The semiconductor layer 21 includes a semiconductor active layer (also referred to as the i-layer below) and a contact layer (also referred to as an n$^+$ layer below) formed on the i-layer, and the source electrode 23 and the drain electrode 24 are respectively connected to the i-layer through the n$^+$ layer. When the TFT 20 is ON, a channel is formed in the i-layer.

Figure 3:
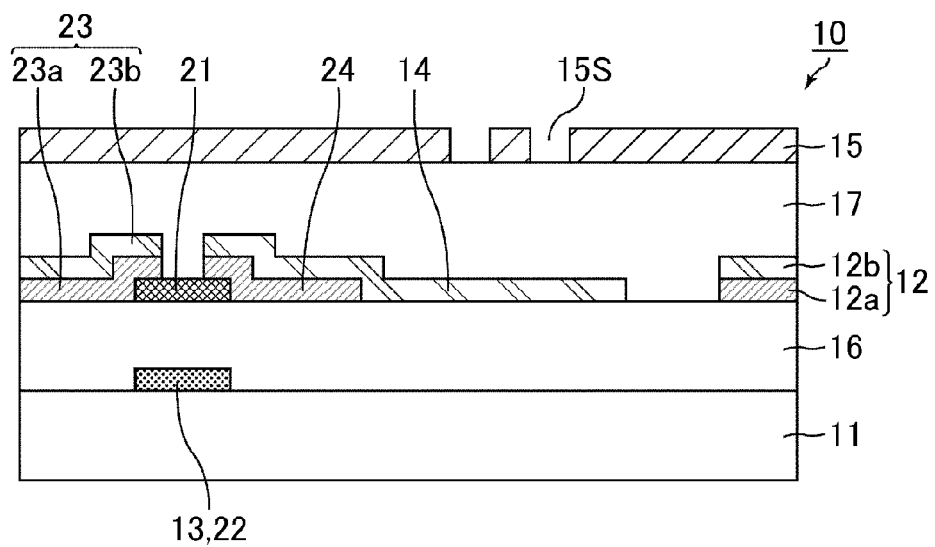
FIG. 3 is a schematic plan view that shows a sub-pixel region of an array substrate included in the liquid crystal display of Embodiment 1, and is a drawing along the line A-B in FIG. 2.

The cross-sectional structure of the sub-pixel area of the array substrate 10 will be described with reference to FIG. 3.

The array substrate 10 has a transparent insulating substrate 11, and the gate bus line 13 is formed on the insulating substrate 11. An insulating layer 16 covering the gate bus line 13 is formed on the insulating substrate 11. The semiconductor layer 21, the source bus line 12, the source electrode 23, the drain electrode 24, and the pixel electrode 14 are formed on the insulating layer 16. The insulating layer 16 functions as a gate insulating film of the TFT 20. The array substrate 10 has a passivation layer 17 covering these members, and the common electrode 15 is formed on the passivation layer 17. The pixel electrode 14 is connected to the drain electrode 24 by layering a portion of the pixel electrode 14 on the drain electrode 24. The source electrode 23 is connected to the source bus line 12 by being formed integrally with the source bus line 12. The source bus line 12 and the source electrode 23 respectively include lower layers 12a and 23a, and upper layers 12b and 23b layered on the lower layers 12a and 23a. The plan view shape of the lower layer 12a is substantially the same as the plan view shape of the upper layer 12b, and both have outlines that substantially match in a plan view. The relation between the lower layer 23a and the upper layer 23b is similar to this.

An image signal is applied from the source bus line 12 to the pixel electrode 14 through the TFT 20. On the other hand, a prescribed voltage common to all pixels is applied to the common electrode 15. Thus, when an image signal is applied to the pixel electrode 14, lines of electrical force are formed in a parabolic shape between the pixel electrode 14 and the common electrode 15, and a fringe field is generated in the liquid crystal layer based on the image signal. The orientation of the liquid crystal molecules is controlled by the fringe field.

The common electrode 15 overlaps the pixel electrode 14 in the sub-pixel area, and a passivation layer 17 is interposed between the two electrodes 14 and 15. A prescribed voltage common to all pixels is applied to the common electrode 15. Thus, when an image signal is applied to the pixel electrode 14, a storage capacitance is formed by these members. In this manner, the pixel electrode 14 and the common electrode 15 function as electrodes for storage capacitance.

Next, the method of manufacturing the liquid crystal display of the present embodiment will be described. First, the manufacturing steps for the array substrate 10 will be described with reference to FIGS. 4 to 26.

First, the insulating substrate 11 is prepared, and the following steps (1) to (7) are performed. Specific examples of the insulating substrate 11 include glass substrates and plastic substrates.

(1) Step of Forming Lower Wiring Layer

A lower conductive film is formed on the insulating substrate 11 by sputtering. Materials for the lower conductive film include molybdenum (Mo), titanium (Ti), aluminum (Al), or an alloy thereof, and the lower conductive film may be formed of a multilayer film including films of these materials. Specific examples suitable for use in the lower conductive film include a multilayer film in which a Ti film, an Al film, and a titanium nitride (TiN) film are layered in this order from the bottom (TiN/Al/Ti film), and a multilayer film in which an Mo film, an Al film, and an Mo film are layered in this order (Mo/Al/Mo film). Next, the lower conductive film is patterned by photolithography, and a lower wiring layer including the gate bus lines 13, the lead-out wiring lines, the input wiring lines is formed.

(2) Step of Forming Insulating Layer and Amorphous Silicon Layer

Next, the insulating film is formed by a dry process using plasma (preferably plasma CVD). Specific examples of the insulating film include a silicon nitride film, a silicon oxide film, and a multilayer film including these. After forming the insulating film, an amorphous silicon film and an amorphous silicon film doped with phosphorus (n$^+$ film) are successively formed in the same chamber. Then, both silicon films are patterned by photolithography, thus forming an amorphous silicon layer. Next, the insulating film is patterned by photolithography, thus forming the insulating layer 16. The insulating layer 16 has a plurality of contact holes (contact holes for terminals, for example) appropriately formed in the frame region.

(3) Step of Forming Conductive Pattern

Figure 4:
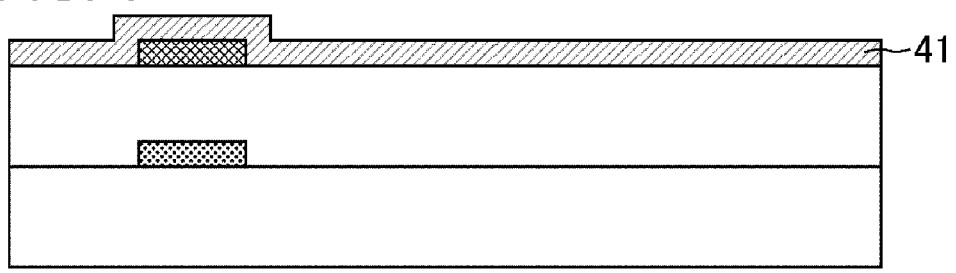
FIG. 4 is a schematic cross-sectional view showing the sub-pixel area of the array substrate in a method of manufacturing the liquid crystal display of Embodiment 1.
Figure 5:
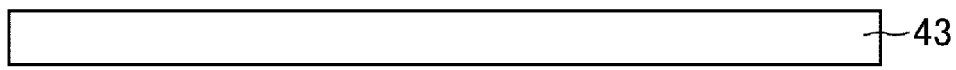
FIG. 5 is a schematic cross-sectional view showing the sub-pixel area of the array substrate in a method of manufacturing the liquid crystal display of Embodiment 1.
Figure 5:
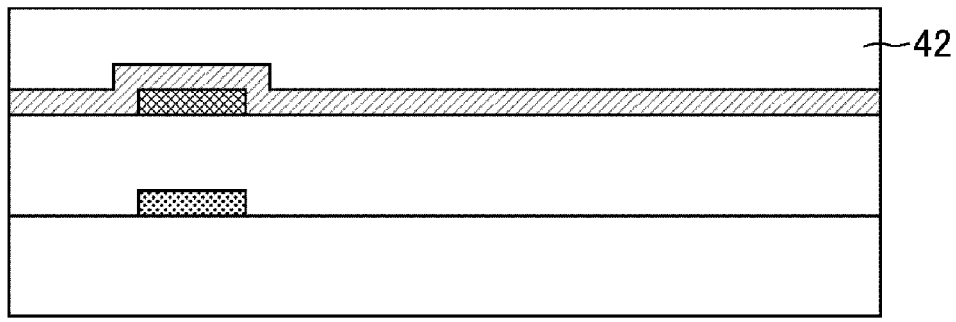
Figure 6:
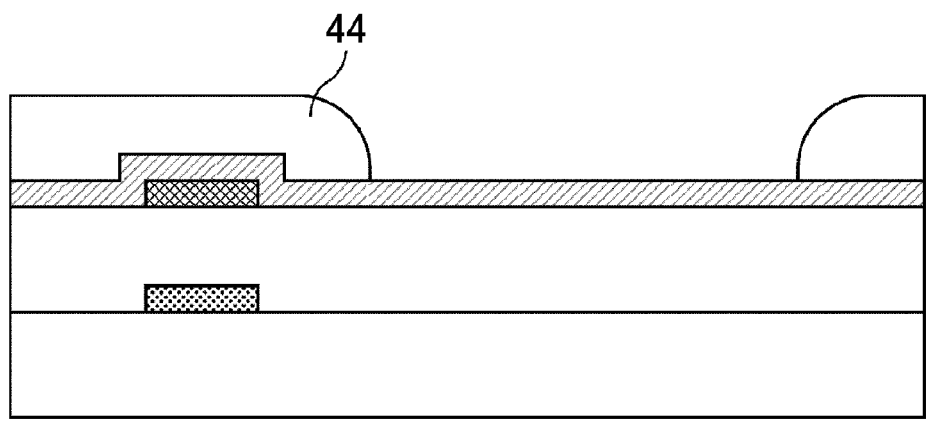
FIG. 6 is a schematic cross-sectional view showing the sub-pixel area of the array substrate in a method of manufacturing the liquid crystal display of Embodiment 1.
Figure 7:
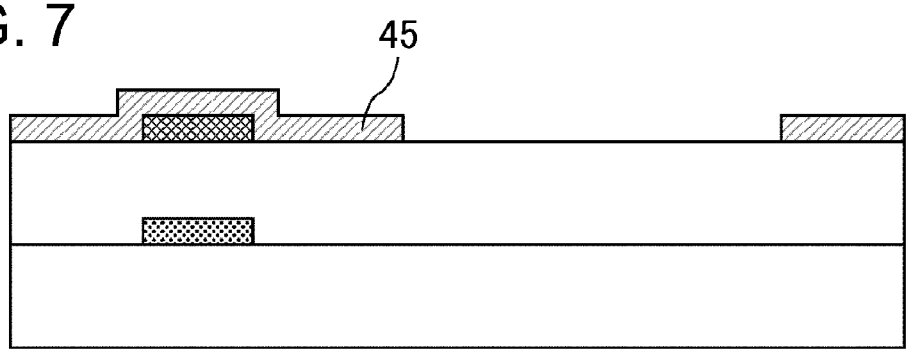
FIG. 7 is a schematic cross-sectional view showing the sub-pixel area of the array substrate in a method of manufacturing the liquid crystal display of Embodiment 1.
Figure 8:
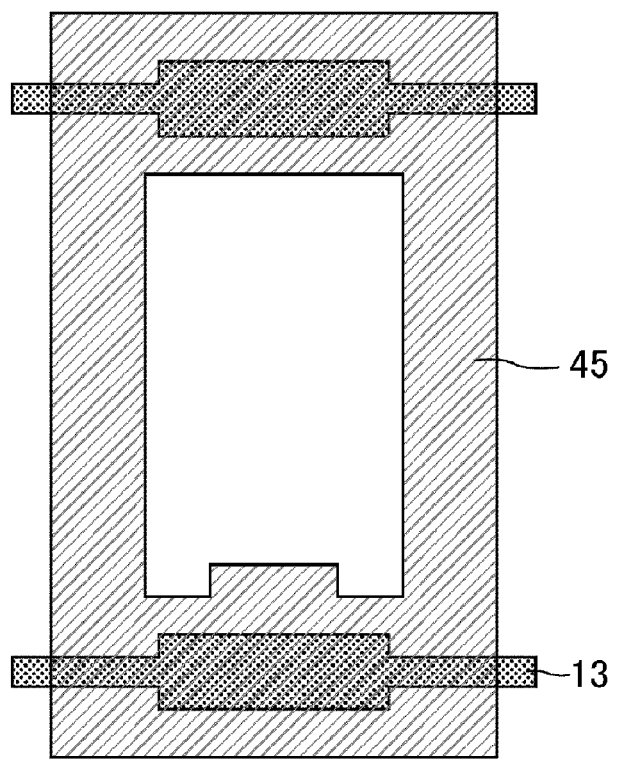
FIG. 8 is a schematic plan view showing the sub-pixel area of the array substrate in a method of manufacturing the liquid crystal display of Embodiment 1.
Figure 34:
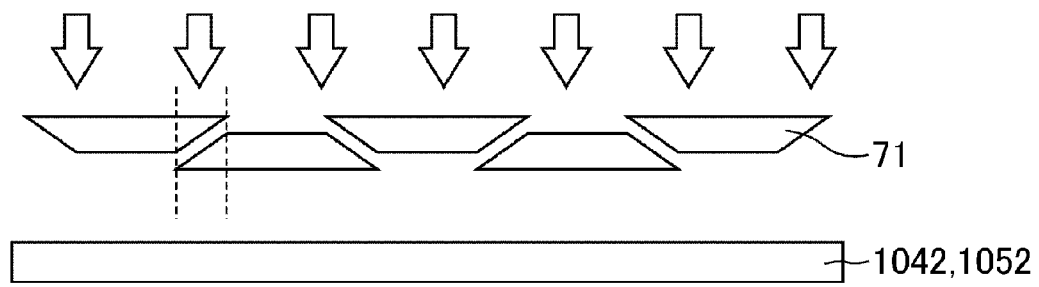
FIG. 34 is a schematic view for describing a method of manufacturing a liquid crystal display, and shows exposure as done by a lens-scanning type exposure device (stepper).
Figure 35:
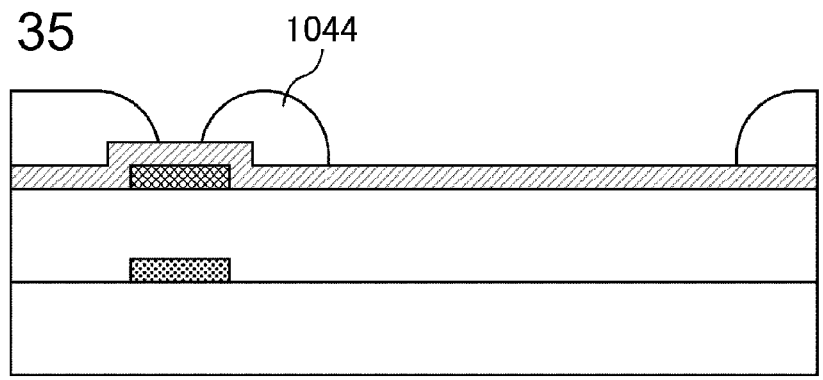
FIG. 35 is a schematic cross-sectional view showing the sub-pixel area of the array substrate in the method of manufacturing the liquid crystal display of Comparison Example 1.
Figure 36:
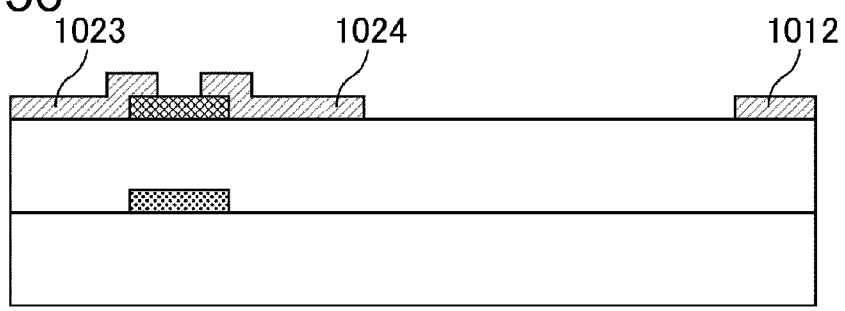
FIG. 36 is a schematic cross-sectional view showing the sub-pixel area of the array substrate in the method of manufacturing the liquid crystal display of Comparison Example 1.
Figure 37:
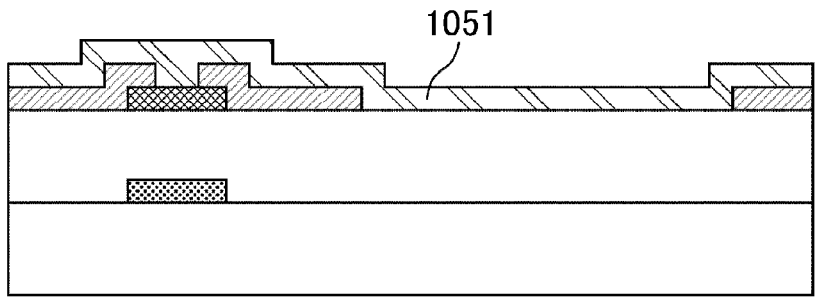
FIG. 37 is a schematic cross-sectional view showing the sub-pixel area of the array substrate in the method of manufacturing the liquid crystal display of Comparison Example 1.
Figure 38:
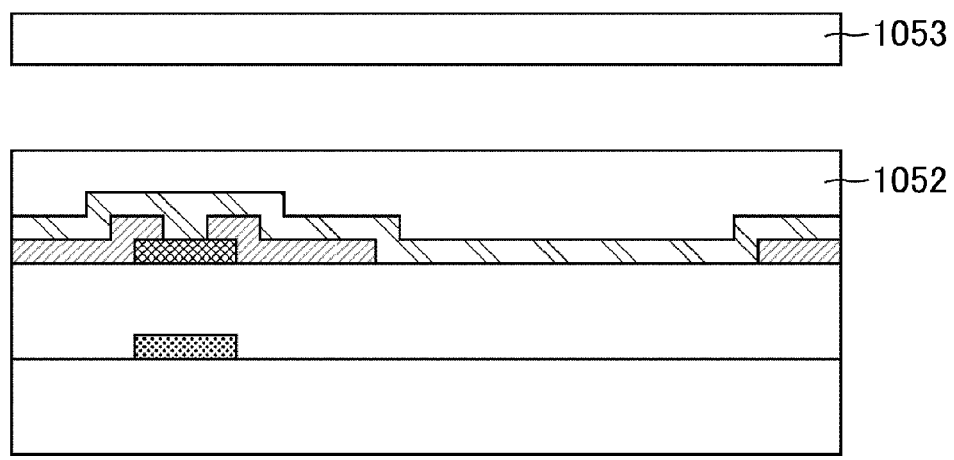
FIG. 38 is a schematic cross-sectional view showing the sub-pixel area of the array substrate in the method of manufacturing the liquid crystal display of Comparison Example 1.
Figure 39:
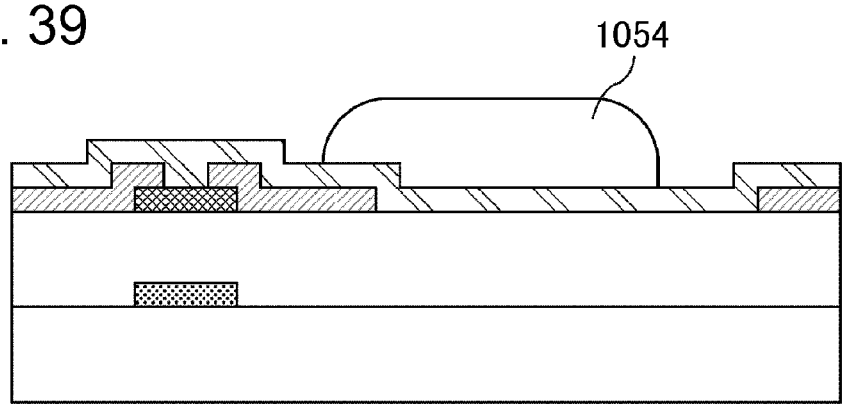
FIG. 39 is a schematic cross-sectional view showing the sub-pixel area of the array substrate in the method of manufacturing the liquid crystal display of Comparison Example 1.
Figure 40:
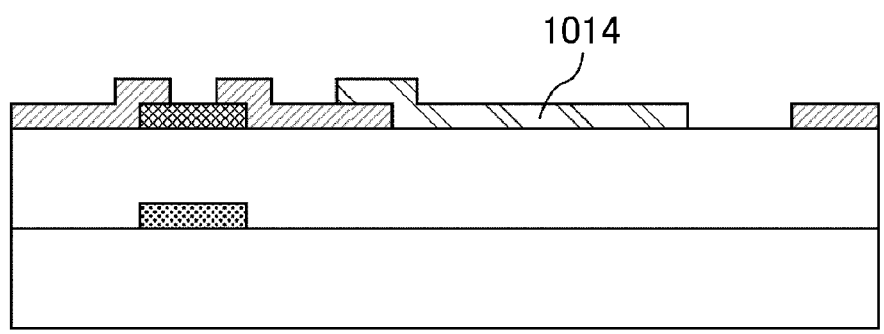
FIG. 40 is a schematic cross-sectional view showing the sub-pixel area of the array substrate in the method of manufacturing the liquid crystal display of Comparison Example 1.

Next, as shown in FIG. 4, the conductive film 41 corresponding to the above-mentioned first conductive film is formed by sputtering. The material for the conductive film 41 includes Mo, Ti, Al, or an alloy thereof, for example, and the conductive film 41 may be a multilayer film including films of all these materials. Typically, the conductive film 41 is non-transparent. A specific example that is suitable for use as the conductive film 41 is a multilayer film including an Mo film and an Al film layered from the bottom in this order (Al/Mo film). Next, a step of photolithography (step corresponding to the first photolithography step mentioned above; also referred to as the first photolithography step) is performed. More specifically, the conductive film 41 is patterned by photolithography. First, a photoresist is coated onto the conductive film 41, thus forming the resist film 42 as shown in FIG. 5. Next, the resist film 42 is exposed through a photomask 43 corresponding to the first photomask mentioned above. The exposure device at this time may be a lens-scanning type exposure device (stepper) such as that shown in FIG. 34. Next, the exposed resist film 42 is etched (developed), and as shown in FIG. 6, the resist pattern 44 is formed. The resist pattern 44 is larger than the source bus line 12 and specifically larger than the lower layer 12a, and at this stage, the width of the source bus line 12 is not set. Then, after the conductive film 41 is etched (patterned) with the resist pattern 44 as the mask, the resist pattern 44 is removed. As a result, as shown in FIGS. 7 and 8, a conductive pattern 45 larger than the lower layer 12a is formed. The conductive pattern 45 is larger than the source bus line 12, and thus, at this stage, the width of the source bus line 12 is not set. Thus, even if the lens-scanning type exposure device is used and there is a difference in width of the resist pattern 44 between the seam portions and other portions, the variation in width of the resist pattern 44 does not affect the width of the source bus line 12.

In the first photolithography step, in the display region, the conductive film 41 is at least left remaining in regions and at least removed in regions that are as follows. The regions where the conductive film 41 is at least left remaining are where the source bus lines 12 are to be formed, and specifically where the lower layer 12a is to be formed. This is because, if the conductive film 41 is removed in these regions, it is not possible to form all portions of the lower layer 12a. The regions where the conductive film 41 is at least removed are the opening regions. Typically, the conductive film 41 is not transparent, and thus, if the conductive film 41 is left in the openings, this reduces the aperture ratio. Whether the conductive film 41 is left remaining or removed in other regions can be appropriately decided, but in the present embodiment, the conductive film 41 is not removed over the regions where the source electrodes 23 are to be formed, and specifically, where the lower layer 23a thereof is to be formed, regions where the drain electrodes 24 are to be formed, and regions where the channel in the i-layer is to be formed. Whether or not the conductive film 41 is removed in regions other than the display region can be appropriately decided.

Figure 9:
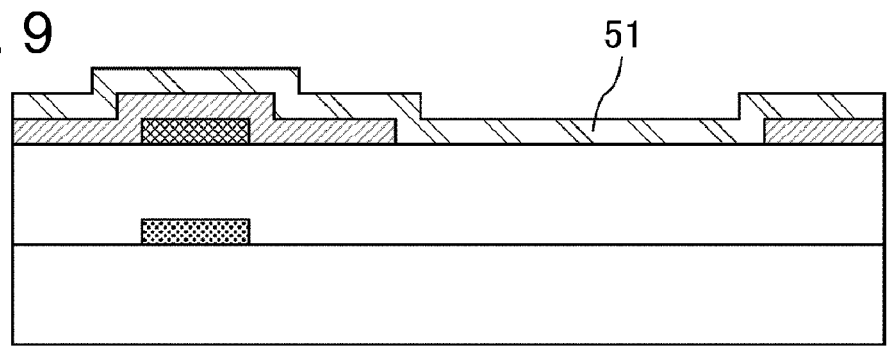
FIG. 9 is a schematic cross-sectional view showing the sub-pixel area of the array substrate in a method of manufacturing the liquid crystal display of Embodiment 1.
Figure 10:
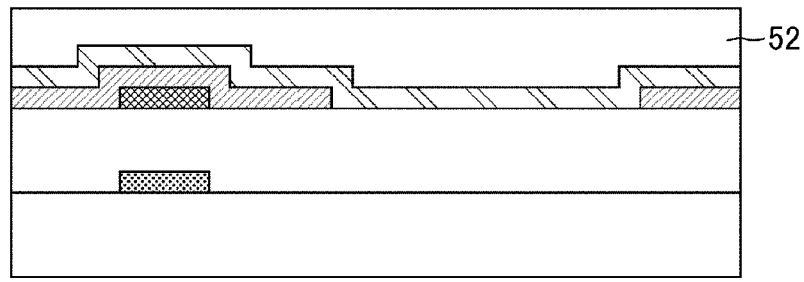
FIG. 10 is a schematic cross-sectional view showing the sub-pixel area of the array substrate in the method of manufacturing the liquid crystal display of Embodiment 1.
Figure 11:
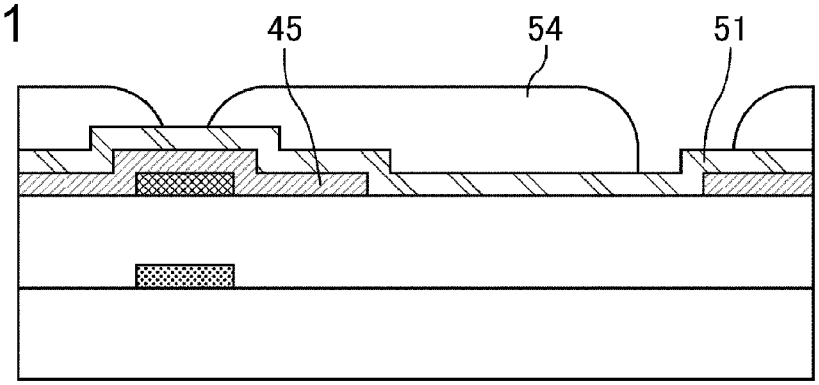
FIG. 11 is a schematic cross-sectional view showing the sub-pixel area of the array substrate in the method of manufacturing the liquid crystal display of Embodiment 1.

(4) Step of Forming Upper Wiring Layer and Pixel Electrode, and Step of Etching Channel Next, as shown in FIG. 9, the transparent conductive film 51 corresponding to the above-mentioned second conductive film is formed by sputtering. Materials for the transparent conductive film 51 include, for example, indium tin oxide (ITO), indium zinc oxide (IZO), and fluorine-doped tin oxide (FTO). As specific examples of the transparent conductive film 51, an ITO film, and specifically an amorphous ITO film (also referred to as an a-ITO film below), or an IZO film is suitable. Next, a step of photolithography (step corresponding to the second photolithography step mentioned above; also referred to as the second photolithography step) is performed. More specifically, the transparent conductive film 51 and the conductive pattern 45 are patterned by photolithography. First, a photoresist is coated onto the transparent conductive film 51, thus forming the resist film 52 as shown in FIG. 10. Next, the resist film 52 is exposed through a photomask 53 corresponding to the second photomask mentioned above. The exposure device at this time may be a lens-scanning type exposure device (stepper) such as that shown in FIG. 34. Next, the exposed resist film 52 is etched (developed), and as shown in FIG. 11, the resist pattern 54 is formed.

Figure 12:
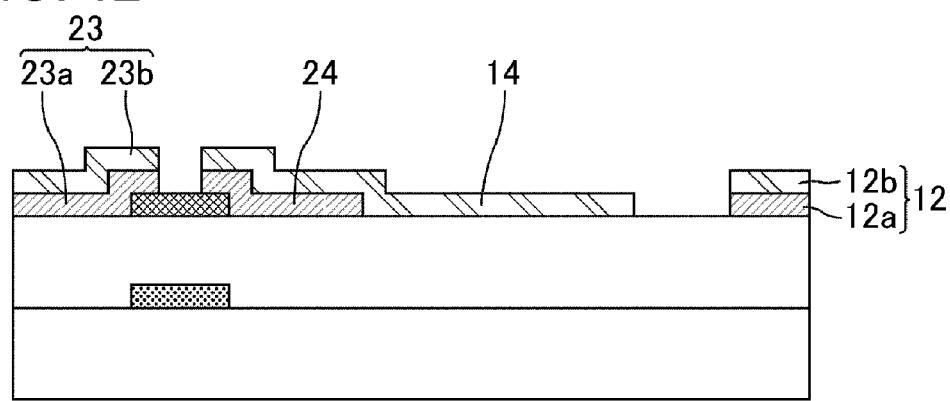
FIG. 12 is a schematic cross-sectional view showing the sub-pixel area of the array substrate in the method of manufacturing the liquid crystal display of Embodiment 1.
Figure 13:
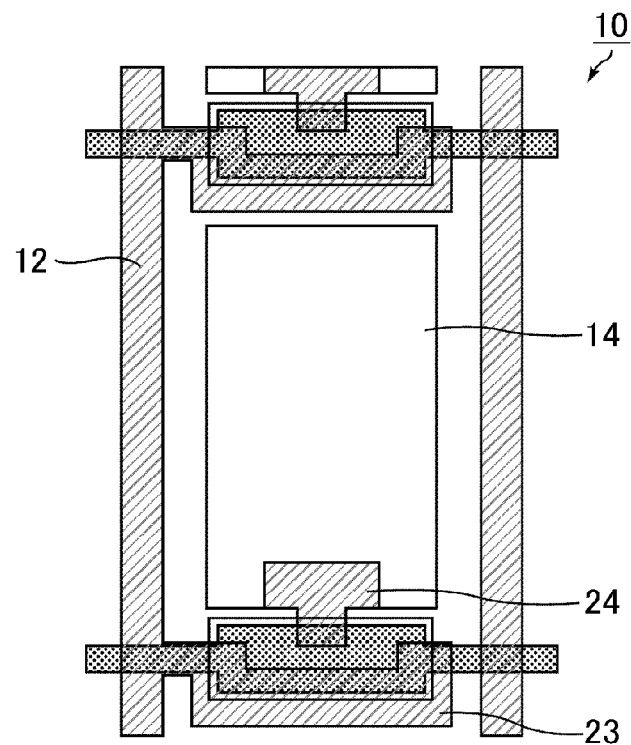
FIG. 13 is a schematic plan view showing the sub-pixel area of the array substrate in the method of manufacturing the liquid crystal display of Embodiment 1.

Then, the transparent conductive film 51 and the conductive pattern 45 are etched (patterned) with the resist pattern 54 as a mask. Next, a portion of the amorphous silicon layer (more specifically, the exposed portion of the n$^+$ film) is etched with the resist pattern 54 as a mask. Then, by removing the resist pattern 54, as shown in FIGS. 12 and 13, the upper wiring layer that includes the source bus line 12 (lower layer 12a and upper layer 12b), the source electrode 23 (lower layer 23a and upper layer 23b), the drain electrode 24 and the like, and the pixel electrode 14 are formed. Also, the semiconductor layer 21 including the i-layer and the n$^+$ layer is formed. The lower layer 12a is formed of the conductive film 41, and the upper layer 12b is formed of the transparent conductive film 51. In the second photolithography step, the conductive pattern 45 and the transparent conductive film 51 are patterned, thereby completing the formation of the lower layer 12a and the upper layer 12b.

In the present embodiment, the source bus line 12 and the pixel electrode 14 are formed using the same resist pattern 54. Thus, there are cases in which the source bus line 12 and the pixel electrode 14 are formed away from where they were originally designed to be formed due to positional deviation of the photomask 53. However, because the source bus line 12 and the pixel electrode 14 are formed using the same photomask 53, the size of positional deviation of the source bus line 12 is substantially the same as the size of positional deviation of the pixel electrode 14. Thus, a case in which the position of the source bus line 12 relative to the pixel electrode 14 deviates greatly from what was originally designed can be prevented.

Also, in the present embodiment, the source bus line 12 and the pixel electrode 14 are formed in the etching step using the same resist pattern 54. Thus, the width of the source bus line 12 and the width of the pixel electrode 14 sometimes differs from what was designed. However, because the source bus line 12 and the pixel electrode 14 are formed in the same etching step, it is possible to make the deviation in width of the source bus line 12 from what was designed the same as the deviation in width of the pixel electrode 14 from what was designed. Thus, a case in which the width of the source bus line 12 in relation to the width of the pixel electrode 14 deviates greatly from what was originally designed can be prevented.

Also, when describing a case in which a lens-scanning type exposure device is used in the first and second photolithography steps, the width of the source bus line 12 is not set during the first photolithography steps, and thus, variations in width of the resist pattern 44 depending on the case do not affect the width of the source bus line 12. On the other hand, in the second photolithography step, there are cases in which differences emerge in the width of the resist pattern 54 between the seam portions of the resist film 52 and other portions of the resist film 52, and in regions corresponding thereto, and the widths of the source bus lines 12 and the widths of the pixel electrodes 14 differ. However, both the source bus line 12 and the pixel electrode 14 are formed in the second photolithography step, and thus, the amount of change in the width of the source bus line 12 and the amount of change in the width of the pixel electrode 14 can be made substantially the same. Thus, a case in which the width of the source bus line 12 in relation to the width of the pixel electrode 14 changes greatly depending on the case can be prevented.

In the second photolithography step, in the display region, regions where at least the transparent conductive film 51 and the conductive pattern 45 are left remaining are regions where the source bus lines 12 are formed, regions where the source electrodes 23 are formed, regions where the drain electrodes 24 are formed, and regions where the pixel electrodes 14 are formed. This is because, if the transparent conductive film 51 is removed in these regions, it becomes impossible to form these members in their entirety. On the other hand, in other regions, as long as the transparent conductive film 51 and the conductive pattern 45 are unneeded, they may be removed. In regions other than the display region, whether the transparent conductive film 51 and the conductive pattern 45 are left remaining or removed can be decided as appropriate.

(5) Step of Forming Passivation Layer

Next, an insulating film is formed by plasma CVD. Specific examples of the insulating film include a silicon nitride film, a silicon oxide film, a photosensitive resin film, and a multilayer film including these. By patterning the insulating film by photolithography, the passivation layer 17 is formed. A plurality of contact holes are appropriately formed in the passivation layer 17 in the frame region.

(6) Step of Forming Common Electrode

Next, a transparent conductive film is formed by sputtering. A similar material is used for this transparent conductive film as is used in the transparent conductive film 51, and specific examples include an a-ITO film and an IZO film. The common electrode 15 is formed by patterning the transparent conductive film by photolithography.

(7) Step of Baking

Lastly, the array substrate 10 is completed in the step of baking.

Then, in a step of cell assembly, on respective surfaces of the array substrate 10 and a separately formed opposite substrate 90, horizontal alignment films including an organic resin such as polyimide are coated. Then, through methods such as rubbing treatment and photoalignment treatment, the respective alignment films are given an alignment treatment such that the liquid crystal molecules are oriented in a prescribed direction.

Next, a sealing material is coated onto either the array substrate 10 or the opposite substrate 90 so as to surround the display region, plastic beads are dispersed on either the array substrate 10 or the opposite substrate 90 as spacers, the array substrate 10 and the opposite substrate 90 are stacked such that the respective alignment films thereof face each other, and then, the substrates are bonded to each other by the sealing material. As a result, a gap of a few μm is formed between the two substrates. Then, liquid crystal is injected into the space surrounded by the sealing material, thus forming the liquid crystal layer.

On both surfaces of the liquid crystal cell produced in this manner, polarizing plates and phase plates (optional) are attached, and the source driver 4 and the gate driver 5 are mounted, and thus, the liquid crystal panel 101 is completed.

Then, the flexible substrate is connected to the liquid crystal panel 101, the control unit and the backlight unit are attached, and these are all housed in a case, thus completing the liquid crystal display of Embodiment 1.

According to the present embodiment, the source bus lines 12 (lower layer 12a and upper layer 12b) and the pixel electrodes 14 are formed simultaneously in the photolithography step (second photolithography step) using the same photomask 53. Thus, it is possible to make deviations in positional relation between the source bus lines 12 and the pixel electrodes 14 and variations in the gaps between the source bus lines 12 and the pixel electrodes 14 small. Thus, it is possible to mitigate variations in Csd capacitance, and therefore, as shown in FIG. 2, it is possible to make a distance d between the source bus line 12 and the pixel electrode 14 small. As a result, it is possible to mitigate the occurrence of display unevenness while improving aperture ratio.

Next, the method of forming the terminals of the array substrate 10 and the structure thereof will be described. Six cases will be described below. The terminals are formed in the same steps as forming the members in the sub-pixel area described above.

<Case 1>

A case in which a TiN/Al/Ti film is used as the lower conductive film, an Al/Mo film is used as the conductive film 41, an IZO film is used for the transparent conductive film 51, and a first structure to be described below is used for the terminals.

<Case 2>

A case in which a TiN/Al/Ti film is used as the lower conductive film, an Al/Mo film is used as the conductive film 41, an IZO film is used for the transparent conductive film 51, and a second structure to be described below is used for the terminals.

<Case 3>

A case in which a TiN/Al/Ti film is used as the lower conductive film, an Al/Mo film is used as the conductive film 41, an a-ITO film is used for the transparent conductive film 51, and a first structure to be described below is used for the terminals.

<Case 4>

A case in which a TiN/Al/Ti film is used as the lower conductive film, an Al/Mo film is used as the conductive film 41, an a-ITO film is used for the transparent conductive film 51, and a second structure to be described below is used for the terminals.

<Case 5>

A case in which an Mo/Al/Mo film is used as the lower conductive film, an Al/Mo film is used as the conductive film 41, an IZO film is used for the transparent conductive film 51, and a second structure to be described below is used for the terminals.

<Case 6>

A case in which an Mo/Al/Mo film is used as the lower conductive film, an Al/Mo film is used as the conductive film 41, an a-ITO film is used for the transparent conductive film 51, and a second structure to be described below is used for the terminals.

Case 1 will be described.

Figure 14:
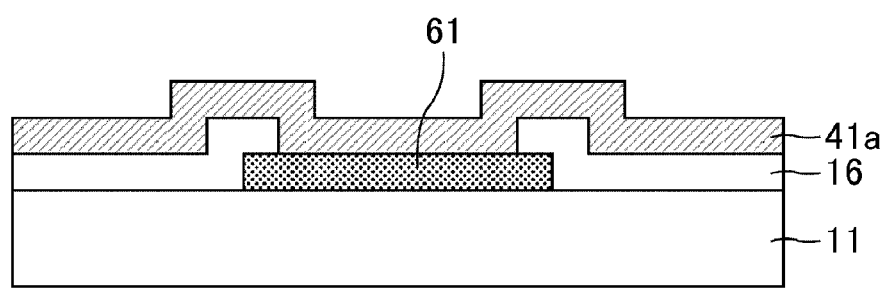
FIG. 14 is a schematic cross-sectional view showing a terminal region of the array substrate in the method of manufacturing the liquid crystal display of Embodiment 1.
Figure 15:
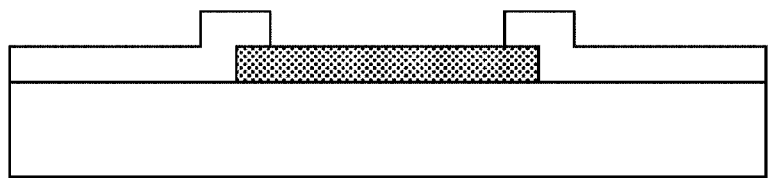
FIG. 15 is a schematic cross-sectional view showing a terminal region of the array substrate in the method of manufacturing the liquid crystal display of Embodiment 1.
Figure 16:
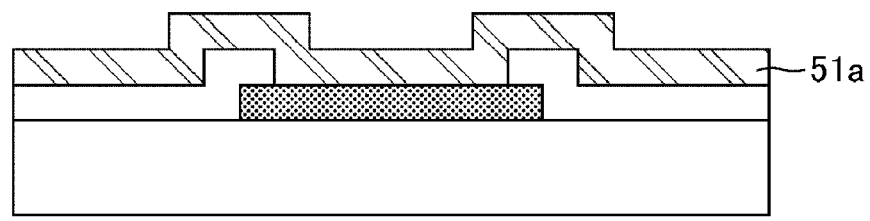
FIG. 16 is a schematic cross-sectional view showing a terminal region of the array substrate in the method of manufacturing the liquid crystal display of Embodiment 1.
Figure 17:
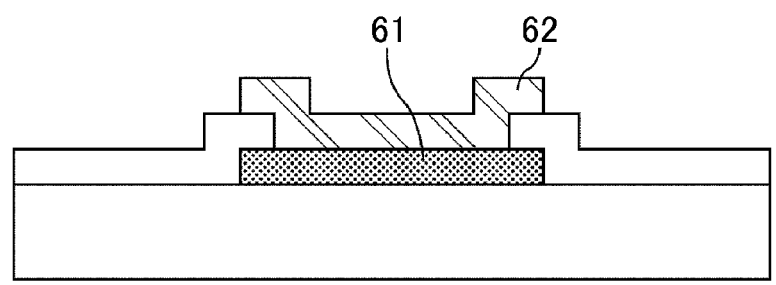
FIG. 17 is a schematic cross-sectional view showing a terminal region of the array substrate in the method of manufacturing the liquid crystal display of Embodiment 1.

First, as shown in FIG. 14, the TiN/Al/Ti film, which is the lower conductive film and the insulating film are respectively patterned, thus forming the lower layer 61 and the insulating layer 16. Then, the Al/Mo film 41a is formed as the conductive film 41. Next, as shown in FIG. 15, in the first photolithography step using the photomask 43, the Al/Mo film 41a is etched away from the terminal region 60. Next, as shown in FIG. 16, an IZO film 51a as a transparent conductive film 51 is formed. Next, in the second photolithography step using the photomask 53, as shown in FIG. 17, the IZO film 51a is patterned to form the upper layer 62. As a result, terminals of the first structure including the lower layer 61 and the upper layer 62 are formed.

Next, Case 2 will be described.

Figure 18:
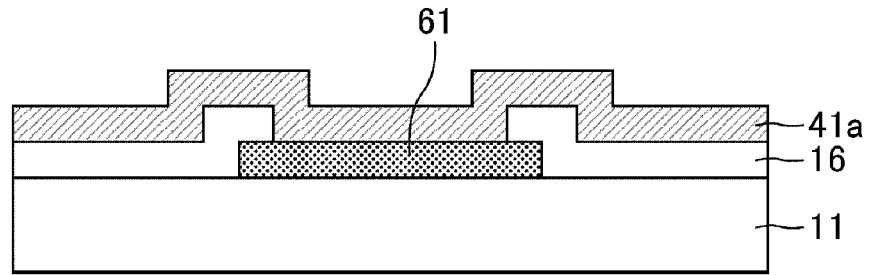
FIG. 18 is a schematic cross-sectional view showing a terminal region of the array substrate in the method of manufacturing the liquid crystal display of Embodiment 1.
Figure 19:
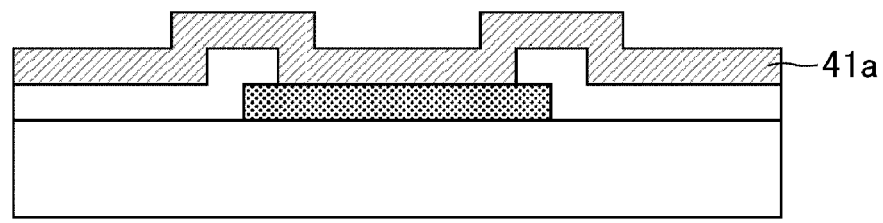
FIG. 19 is a schematic cross-sectional view showing a terminal region of the array substrate in the method of manufacturing the liquid crystal display of Embodiment 1.
Figure 20:
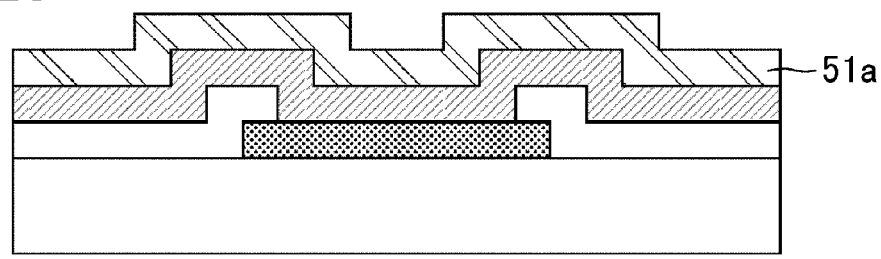
FIG. 20 is a schematic cross-sectional view showing a terminal region of the array substrate in the method of manufacturing the liquid crystal display of Embodiment 1.
Figure 21:
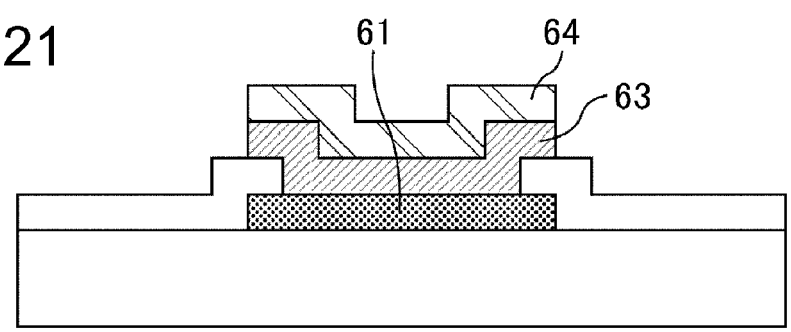
FIG. 21 is a schematic cross-sectional view showing a terminal region of the array substrate in the method of manufacturing the liquid crystal display of Embodiment 1.

First, as shown in FIG. 18, similar to Case 1, the TiN/Al/Ti film, which is the lower conductive film and the insulating film are respective patterned, thus forming the lower layer 61 and the insulating layer 16. Then, the Al/Mo film 41a is formed as the conductive film 41. Next, in the first photolithography step using the photomask 43, the Al/Mo film 41a is patterned. However, as shown in FIG. 19, the Al/Mo film 41a is not removed in the terminal region 60. Next, as shown in FIG. 20, an IZO film 51a as a transparent conductive film 51 is formed. Next, in the second photolithography step using the photomask 53, as shown in FIG. 21, the Al/Mo film 41a and the IZO film 51a are patterned, thus forming a middle layer 63 and the upper layer 64. As a result, terminals of the second structure including the lower layer 61, the middle layer 63, and the upper layer 64 are formed.

Next, Case 3 will be described.

Like Case 1, terminals of the first structure are formed, with the difference that an a-ITO film is used for the transparent conductive film 51 instead of the IZO film 51a.

Next, Case 4 will be described.

Like Case 2, terminals of the second structure are formed, with the difference that an a-ITO film is used for the transparent conductive film 51 instead of the IZO film 51a.

Next, Case 5 will be described.

Like Case 2, terminals of the second structure are formed, with the difference that an Mo/Al/Mo film is used for the lower conductive film instead of the TiN/Al/Ti film.

Next, Case 6 will be described.

Like Case 4, terminals of the second structure are formed, with the difference that an Mo/Al/Mo film is used for the lower conductive film instead of the TiN/Al/Ti film.

Figure 22:
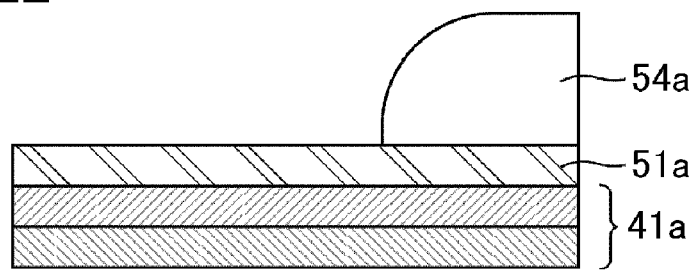
FIG. 22 is a schematic cross-sectional view showing a terminal region of the array substrate in the method of manufacturing the liquid crystal display of Embodiment 1.
Figure 23:
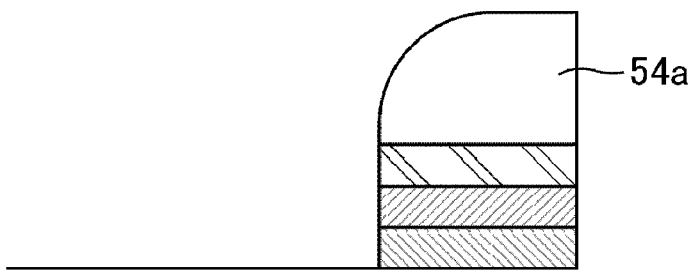
FIG. 23 is a schematic cross-sectional view showing a terminal region of the array substrate in the method of manufacturing the liquid crystal display of Embodiment 1.

In Cases 2 and 5, after forming the resist pattern 54a as shown in FIG. 22, a mixed acid is used as the etchant in order to simultaneously etch the IZO film 51a and the Al/Mo film 41a as shown in FIG. 23.

Figure 24:
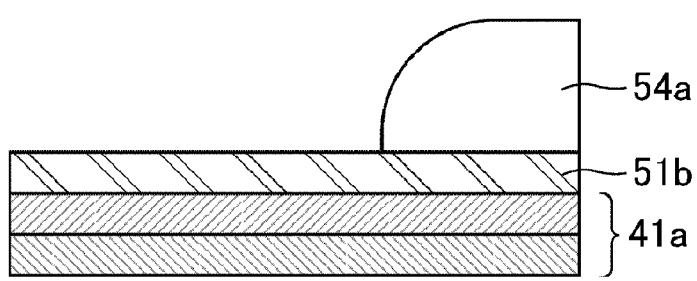
FIG. 24 is a schematic cross-sectional view showing a terminal region of the array substrate in the method of manufacturing the liquid crystal display of Embodiment 1.
Figure 25:
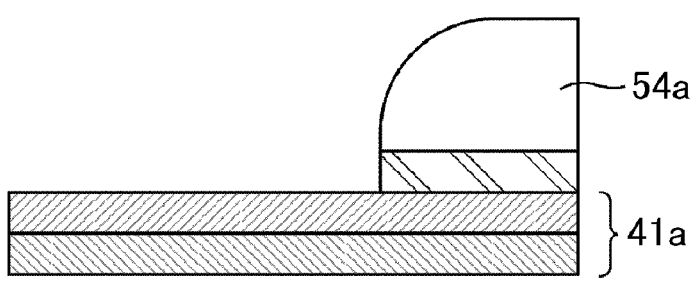
FIG. 25 is a schematic cross-sectional view showing a terminal region of the array substrate in the method of manufacturing the liquid crystal display of Embodiment 1.
Figure 26:
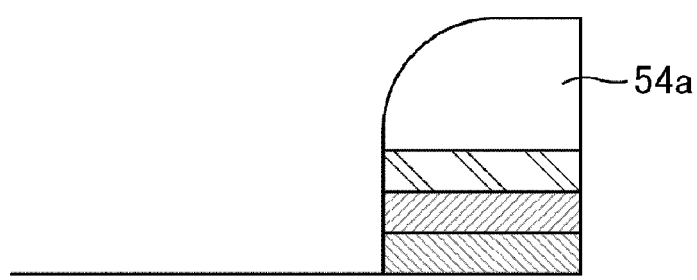
FIG. 26 is a schematic cross-sectional view showing a terminal region of the array substrate in the method of manufacturing the liquid crystal display of Embodiment 1.

On the other hand, in Cases 4 and 6, after forming the resist pattern 54a as shown in FIG. 24, first, oxalic acid is used as the etchant to etch the a-ITO film 51b as shown in FIG. 25, and then, a mixed acid is used as the etchant to etch the Al/Mo film 41a as shown in FIG. 26.

Also, in Cases 2 and 4 to 6 in which terminals of the second structure are formed, in the first photolithography step, the conductive film 41 needs to be left remaining in at least the regions where the terminals (middle layer) are to be formed. Therefore, as described above, the conductive film 41 may be left in a region larger than the region where the terminals (middle layer) are to be formed (the entire area of the terminal region 60, for example), or the conductive film 41 may be appropriately removed in regions other than regions where the terminals (middle layer) are to be formed in the terminal region 60.

On the other hand, in all cases, in the second photolithography step, the transparent conductive film 51 needs only to be left in the region where the terminals (upper layer) are to be formed.

Also, if the topmost layer of the lower conductive film is not etched by the etchant used for the conductive film 41 as in Cases 1 to 4, there is no restriction on where the conductive film 41 is left remaining in the first photolithography step, and this can be chosen as appropriate. Even in this case, in the second photolithography step, the transparent conductive film 51 needs only to be left in the region where the terminals (upper layer) are to be formed.

Embodiment 2

A liquid crystal display of Embodiment 2 is similar to the liquid crystal display of Embodiment 1 other than the layout of the sub-pixels.

Figure 27:
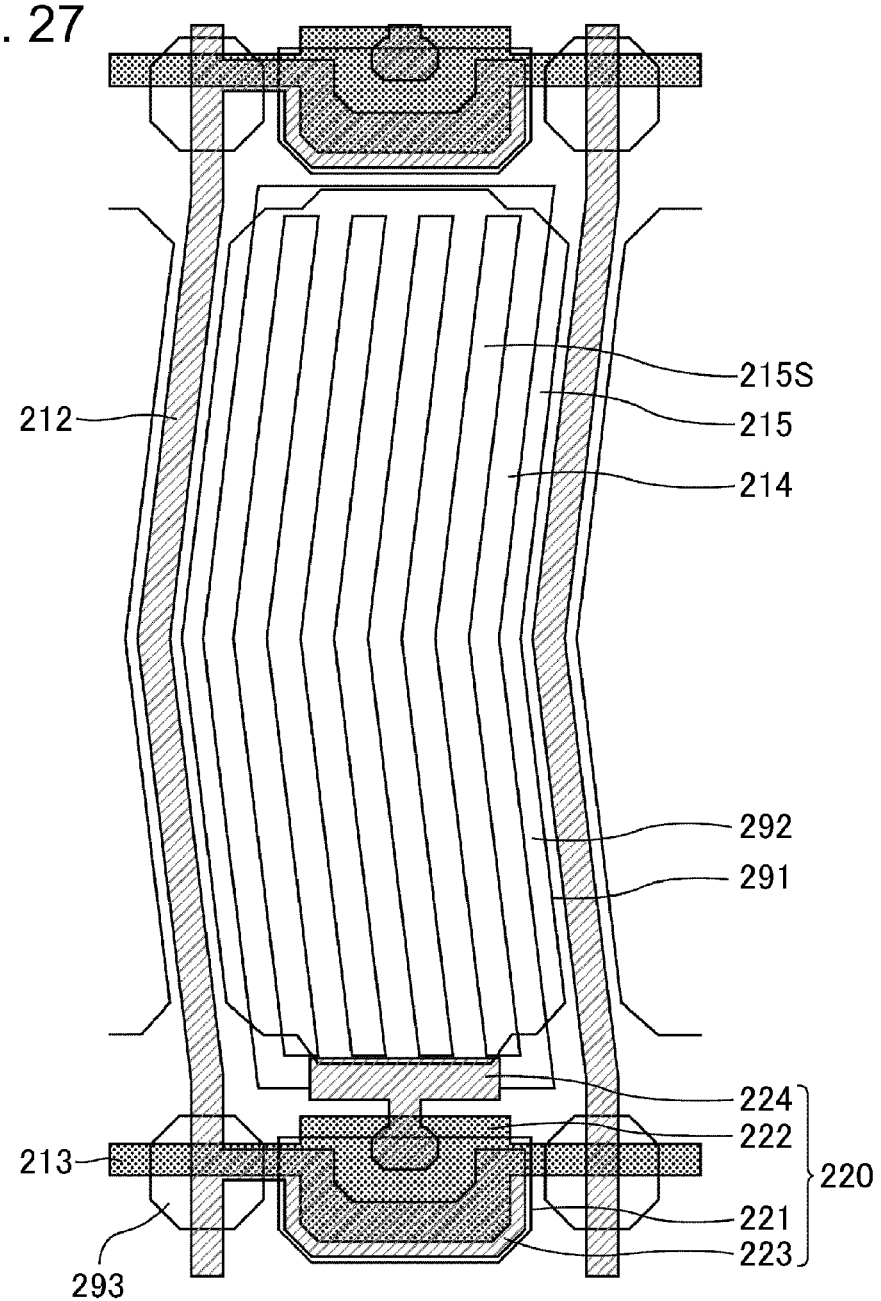
FIG. 27 is a schematic plan view of a sub-pixel area of a liquid crystal panel included in a liquid crystal display of Embodiment 2.

As shown in FIG. 27, the array substrate included in the liquid crystal display of the present embodiment has source bus lines 212, gate bus lines 213, TFTs 220, pixel electrodes 214, and a common electrode 215 having formed therein slits 215S. The TFT 220 includes a gate electrode 222, a source electrode 223 connected to the source bus line 212, a semiconductor layer 221, and a drain electrode 224 connected to a pixel electrode 214. The source bus line 212 is bent in a V-shape, and the slits 215S are also bent so as to be parallel to the source bus line 212. When no voltage is applied to the liquid crystal molecules, the liquid crystal molecules are oriented in the horizontal direction (left-and-right direction) in FIG. 27.

The opposite substrate included in the liquid crystal display of the present embodiment has a black matrix 291 (BM) that blocks light in regions between adjacent sub-pixel areas, color filters 292 surrounded by the BM 291, and columnar spacers 293 that function as spacers.

A better viewing angle can be attained in the present embodiment compared to Embodiment 1. The liquid crystal display of the present embodiment can be manufactured by the same manufacturing method as Embodiment 1, and thus, in the present embodiment also, it is possible to mitigate the occurrence of display unevenness while improving the aperture ratio.

Embodiment 3

A liquid crystal display of Embodiment 3 is similar to the liquid crystal display of Embodiment 1 other than the structure of the source bus lines.

Figure 28:
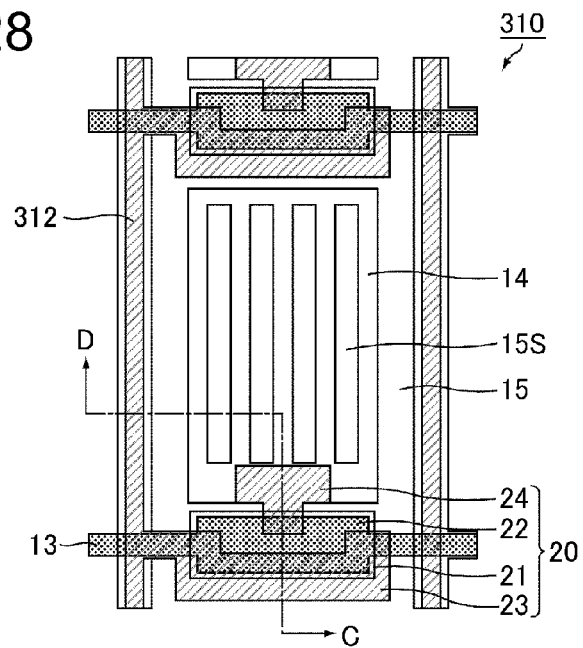
FIG. 28 is a schematic plan view of a sub-pixel area of an array substrate included in a liquid crystal display of Embodiment 3.
Figure 29:
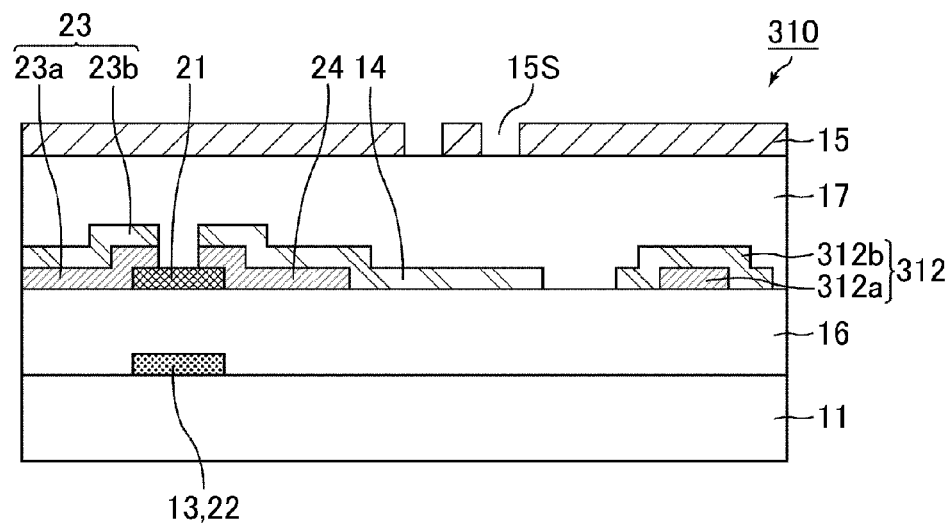
FIG. 29 is a schematic cross-sectional view that shows a sub-pixel region of an array substrate included in the liquid crystal display of Embodiment 3, and is a view along the line C-D in FIG. 28.
Figure 30:
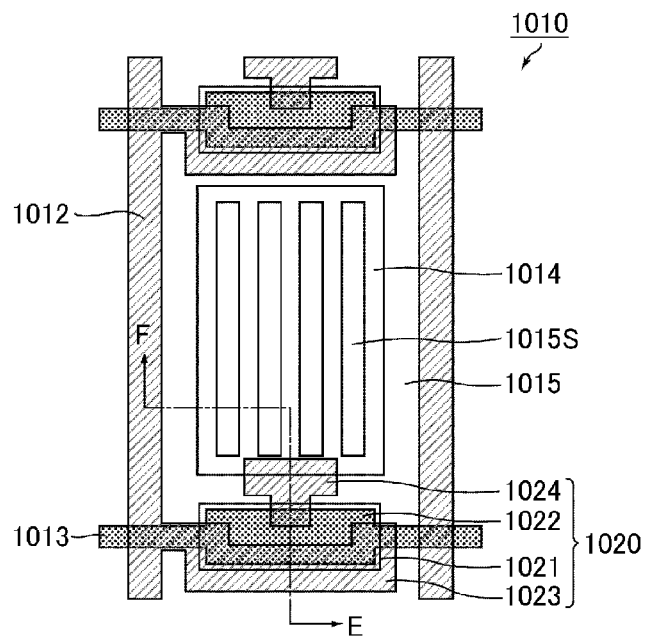
FIG. 30 is a schematic plan view of a sub-pixel area of an array substrate included in a liquid crystal display of Comparison Example 1.
Figure 31:
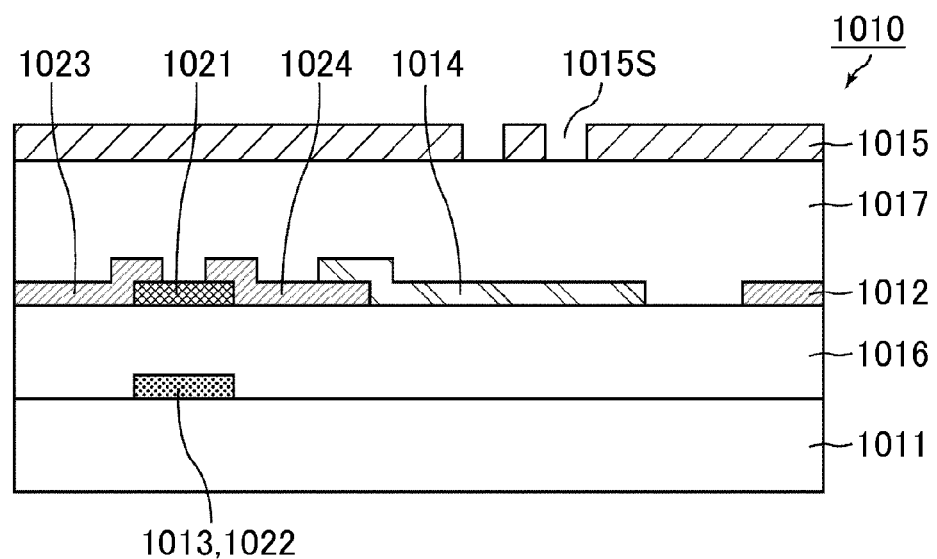
FIG. 31 is a schematic cross-sectional view that shows a sub-pixel region of an array substrate included in the liquid crystal display of Comparison Example 1, and is a view along the line E-F in FIG. 30.
Figure 32:
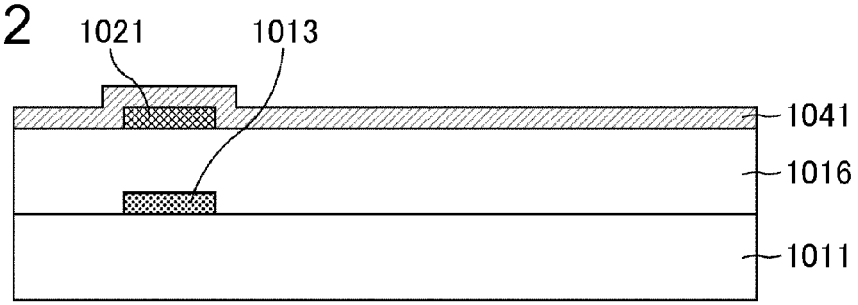
FIG. 32 is a schematic cross-sectional view showing the sub-pixel area of the array substrate in the method of manufacturing the liquid crystal display of Comparison Example 1.
Figure 33:
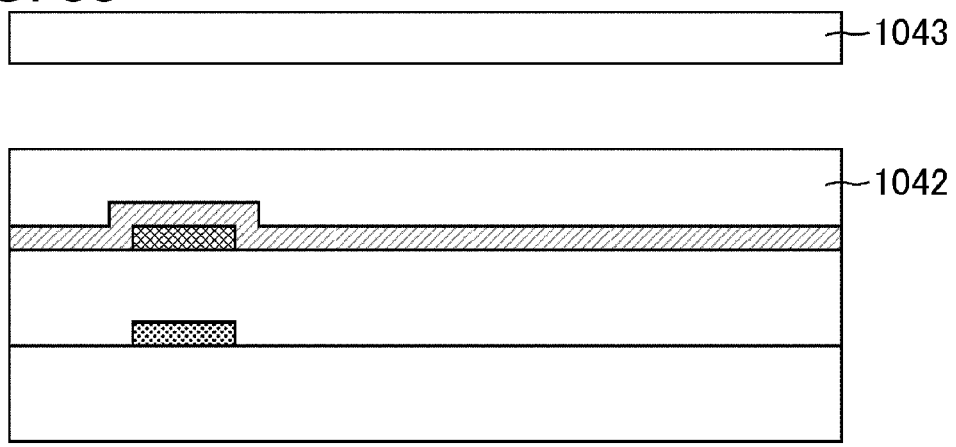
FIG. 33 is a schematic cross-sectional view showing the sub-pixel area of the array substrate in the method of manufacturing the liquid crystal display of Comparison Example 1.

As shown in FIGS. 28 and 29, an array substrate 310 included in the liquid crystal display of the present embodiment has source bus lines 312 instead of the source bus lines 12. The source bus lines 312 include a lower layer 312a, and an upper layer 312b layered on the lower layer 312a. The lower layer 312a is smaller than the upper layer 312b, and is covered by the upper layer 312b.

The method of manufacturing the liquid crystal display of the present embodiment is similar to the manufacturing method of Embodiment 1 other than that the lower layer 312a is formed in the first photolithography step and that the upper layer 312b is formed in the second photolithography step. Thus, in the present embodiment also, it is possible to mitigate the occurrence of display unevenness while improving the aperture ratio.

In Embodiment 1, the conductive pattern 45 and the transparent conductive film 51 are patterned to form the lower layer 12a and the upper layer 12b in the same second photolithography step, but in the present embodiment, the conductive film 41 is patterned in the first photolithography step to complete the lower layer 312, and the transparent conductive film 51 is patterned in the second photolithography step to complete the upper layer 312b.

DESCRIPTION OF REFERENCE CHARACTERS 2 display portion
3 pixel
4 source driver
5 gate driver
10, 310, 1010 array substrate
11, 1011 insulating substrate
12, 212, 312, 1012 source bus line
12a, 312a lower layer
12b, 312b upper layer
13, 213, 1013 gate bus line
14, 214, 1014 pixel electrode
15, 215, 1015 common electrode
15S, 215S, 1015S slit
16, 1016 insulating layer
17, 1017 passivation layer
20, 220, 1020 TFT
21, 221, 1021 semiconductor layer 22, 222, 1022 gate electrode
23, 223, 1023 source electrode
23a lower layer
23b upper layer
24, 224, 1024 drain electrode
41, 1041 conductive film
41a Al/Mo film
42, 52, 1042, 1052 resist film
43, 53, 1043, 1053 photomask
44, 54, 54a, 1044, 1054 resist pattern
45 conductive pattern
51, 1051 transparent conductive film
51a IZO film
51b a-ITO film
60 terminal region
61 lower layer
62, 64 upper layer
63 middle layer
71 lens
90 opposite substrate
101 liquid crystal panel
291 black matrix
292 color filter
293 columnar spacer

The invention claimed is:

1. A method of manufacturing a liquid crystal display, the liquid crystal display including an active matrix substrate, the active matrix substrate including an insulating layer, and a source bus line and a pixel electrode, both of which are provided on the insulating layer, the source bus line including a lower layer and an upper layer layered on the lower layer, the method comprising:

forming a first conductive film on the insulating layer on the active matrix substrate;

a first photolithography step of patterning the first conductive film using a first photomask, the patterned first conductive film including at least a portion to become the lower layer of the source bus line and being absent in at least a region where the pixel electrode is to be formed;

forming a second conductive film over the patterned first conductive film and on a portion of the insulating layer where the first conductive film is absent; and a second photolithography step of patterning at least the second conductive film using a second photomask to form the upper layer of the source bus line and the pixel electrode both made of the second conductive layer, thereby forming the source bus line having the first conductive film as the lower layer and the second conductive film as the upper layer, wherein, in the first photolithography step, the first conductive film is patterned to form a conductive pattern larger than the lower layer of the source bus line, and wherein, in the second photolithography step, said conductive pattern of the first conductive film and the second conductive film are patterned to form the lower layer and the upper layer, respectively of the source bus line.

2. The method of manufacturing a liquid crystal display according to claim 1, wherein the second conductive film is transparent.

* * * * *